United States Patent
Prather

(10) Patent No.: US 10,846,021 B2
(45) Date of Patent: *Nov. 24, 2020

(54) MEMORY DEVICES WITH PROGRAMMABLE LATENCIES AND METHODS FOR OPERATING THE SAME

(71) Applicant: Micron Technology, Inc., Boise, ID (US)

(72) Inventor: Matthew A. Prather, Boise, ID (US)

(73) Assignee: Micron Technology, Inc., Boise, ID (US)

(*) Notice: Subject to any disclaimer, the term of this patent is extended or adjusted under 35 U.S.C. 154(b) by 42 days.

This patent is subject to a terminal disclaimer.

(21) Appl. No.: 16/212,565

(22) Filed: Dec. 6, 2018

(65) Prior Publication Data
US 2019/0107974 A1 Apr. 11, 2019

Related U.S. Application Data

(63) Continuation of application No. 15/693,095, filed on Aug. 31, 2017, now Pat. No. 10,282,133.

(51) Int. Cl.
| | |
|---|---|
| *G06F 12/00* | (2006.01) |
| *G06F 3/06* | (2006.01) |
| *G06F 13/16* | (2006.01) |
| *G11C 7/10* | (2006.01) |
| *G11C 7/22* | (2006.01) |
| *G11C 11/4076* | (2006.01) |

(52) U.S. Cl.
CPC .......... *G06F 3/0659* (2013.01); *G06F 3/0611* (2013.01); *G06F 3/0683* (2013.01); *G06F 13/1689* (2013.01); *G11C 7/1015* (2013.01); *G11C 7/22* (2013.01); *G11C 11/4076* (2013.01); *G11C 2207/229* (2013.01); *G11C 2207/2272* (2013.01); *G11C 2207/2281* (2013.01)

(58) Field of Classification Search
None
See application file for complete search history.

(56) References Cited

U.S. PATENT DOCUMENTS

| | | | |
|---|---|---|---|
| 10,282,133 B2 * | 5/2019 | Prather | ............... G06F 3/0659 |
| 10,282,134 B2 | 5/2019 | Prather et al. | |
| 2012/0117338 A1 | 5/2012 | Vaidyanath et al. | |
| 2013/0039128 A1 | 2/2013 | Amidi et al. | |
| 2015/0286405 A1 | 10/2015 | Chang et al. | |

* cited by examiner

*Primary Examiner* — Daniel D Tsui
(74) *Attorney, Agent, or Firm* — Perkins Coie LLP

(57) ABSTRACT

A memory device is provided. The memory device includes a memory array, operation circuitry configured to perform a memory operation in the memory array in response to a command received from a connected host device, and delay circuitry configured to delay the performance of the memory operation in response to one or more bits received with the command. The one or more bits indicate a duration by which to delay the performance of the memory operation.

19 Claims, 7 Drawing Sheets

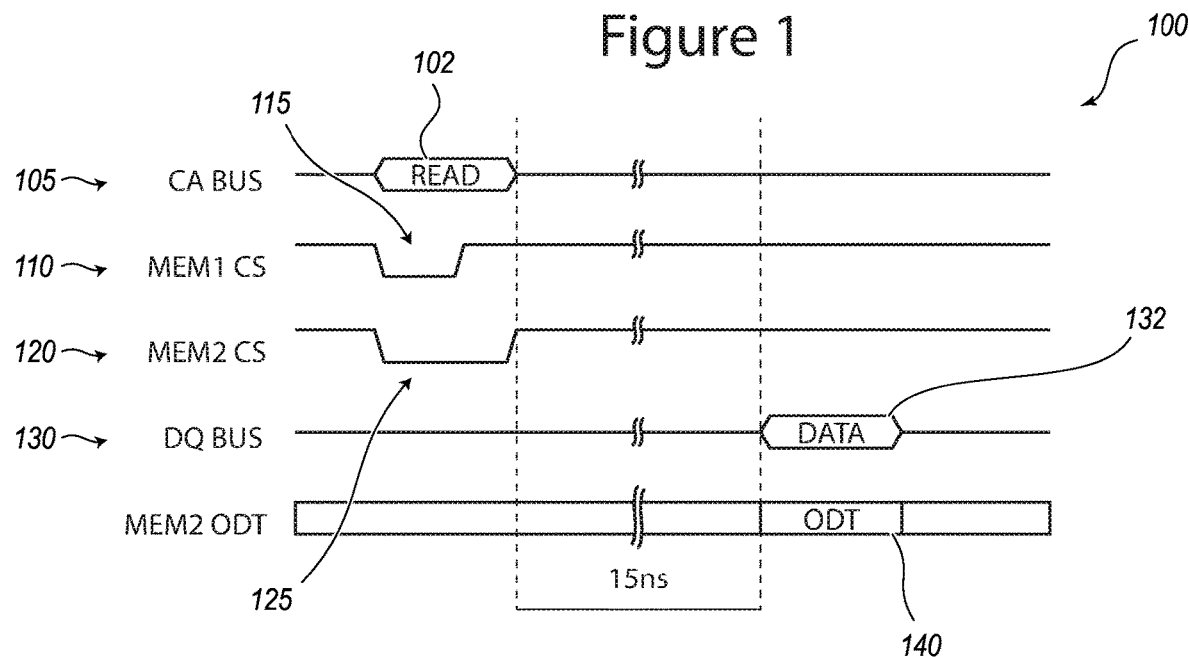
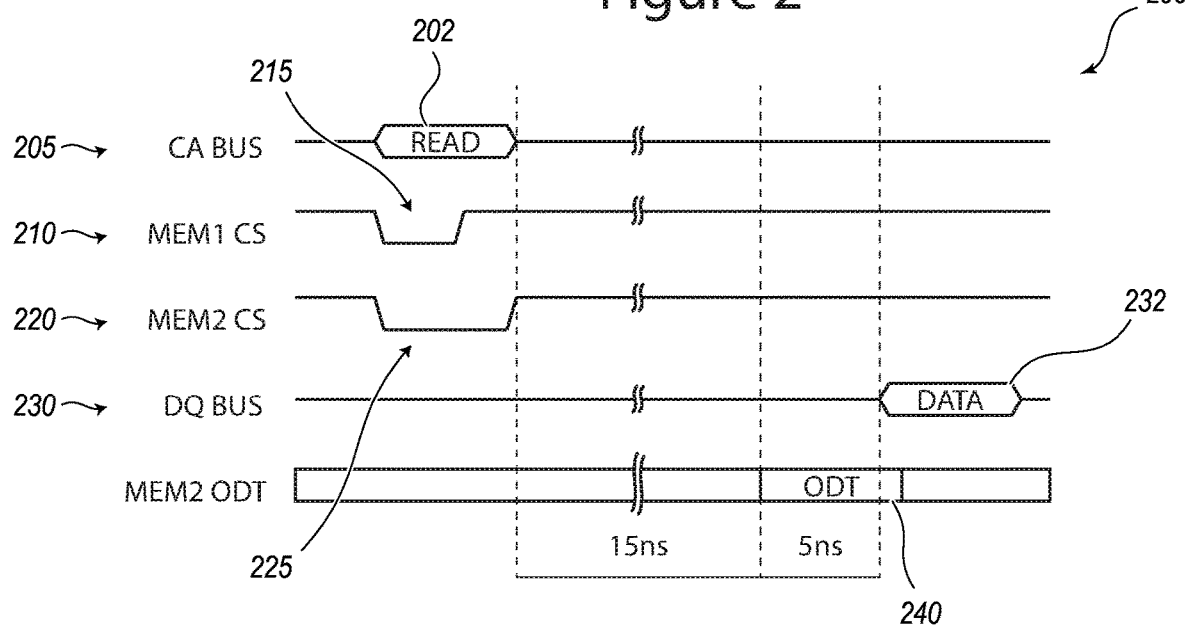

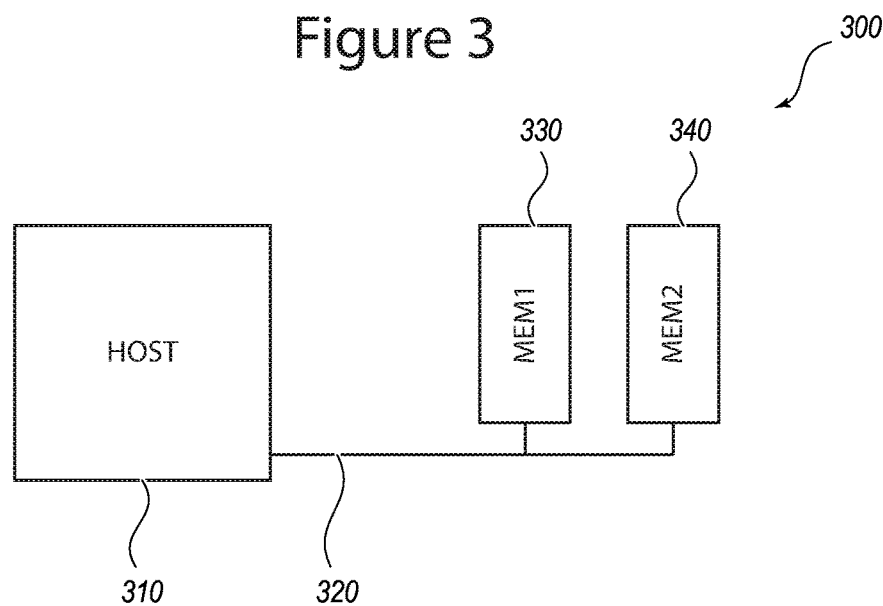
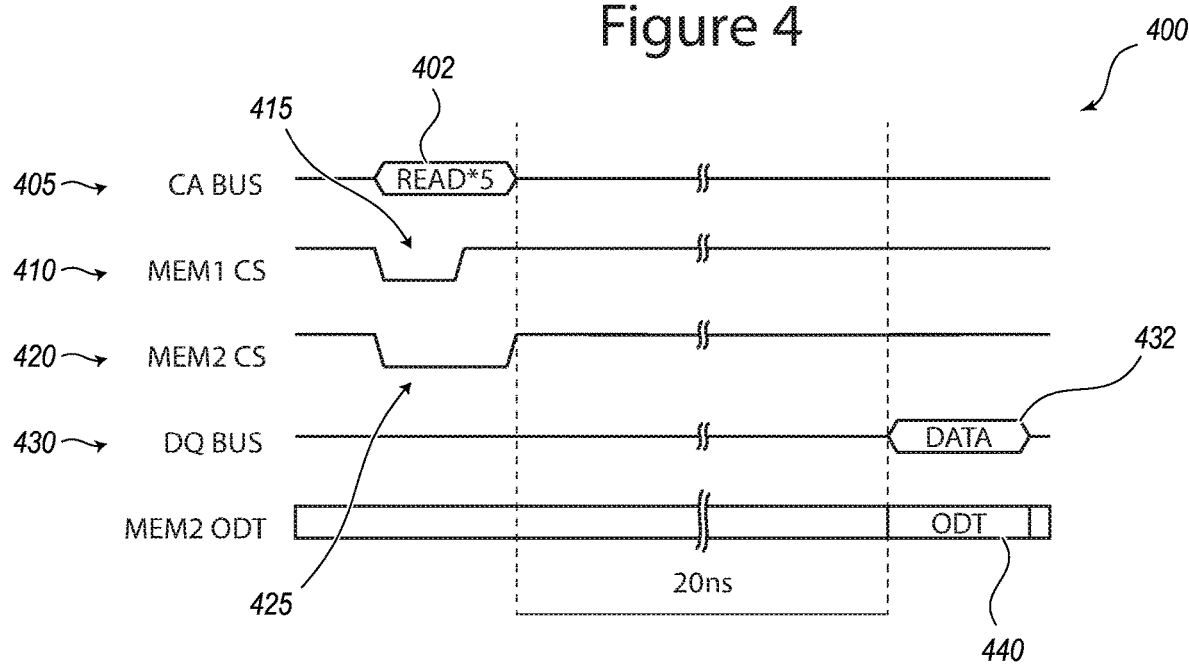

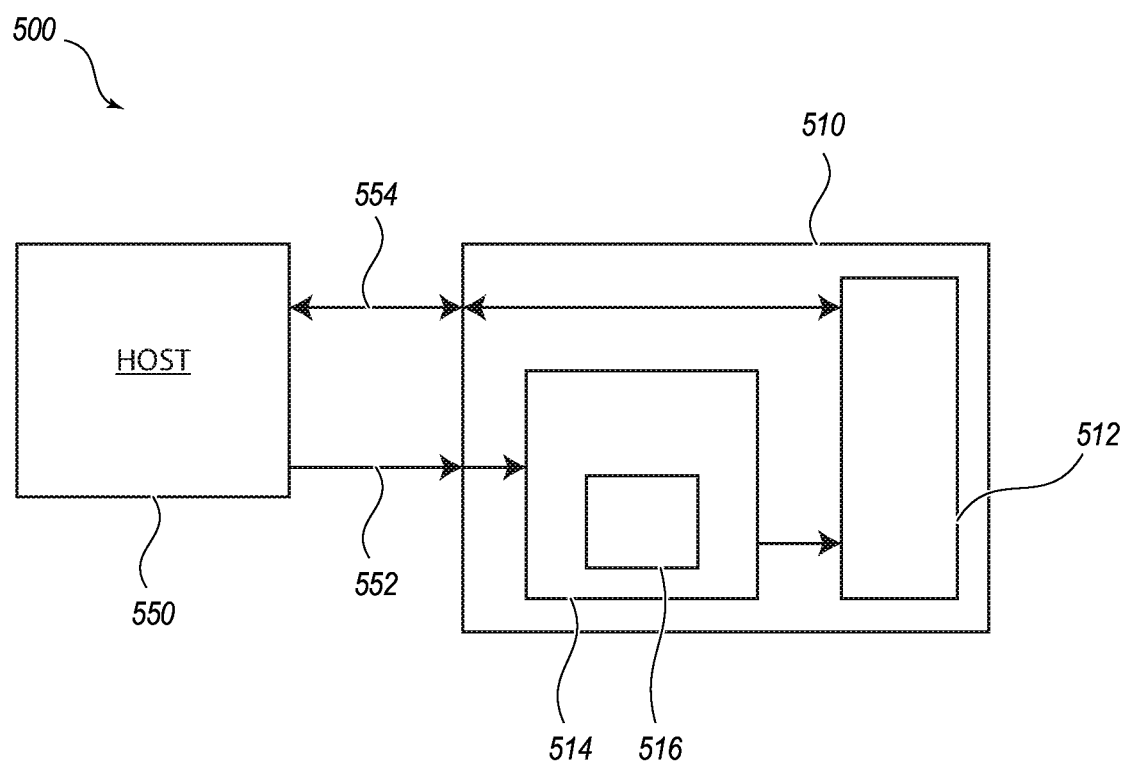

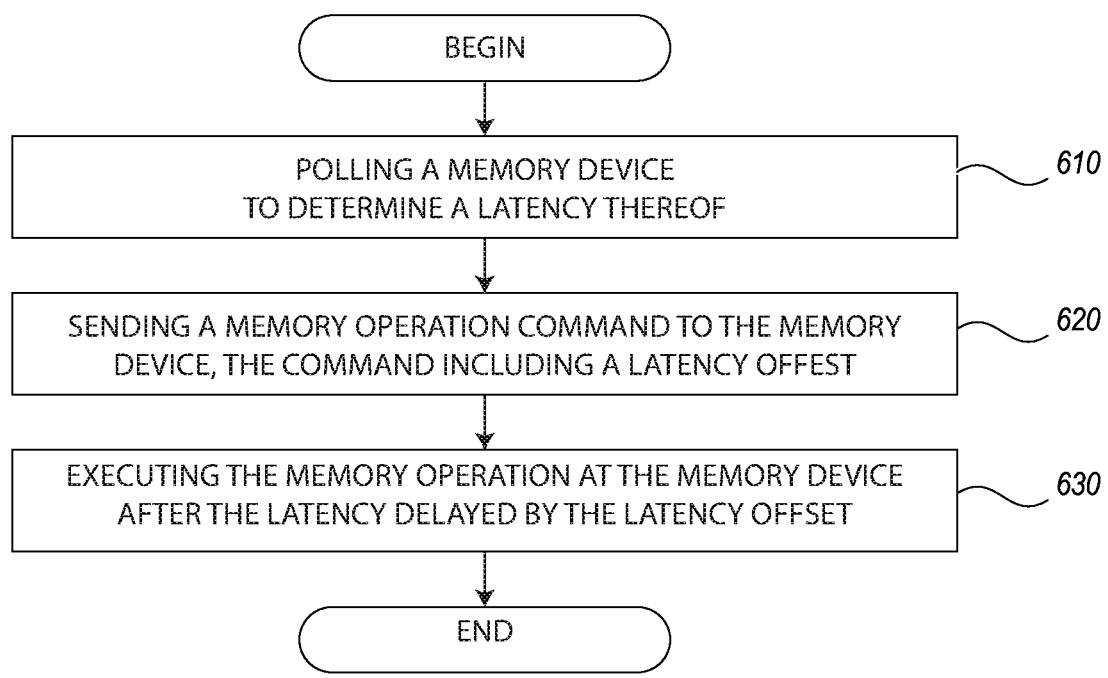

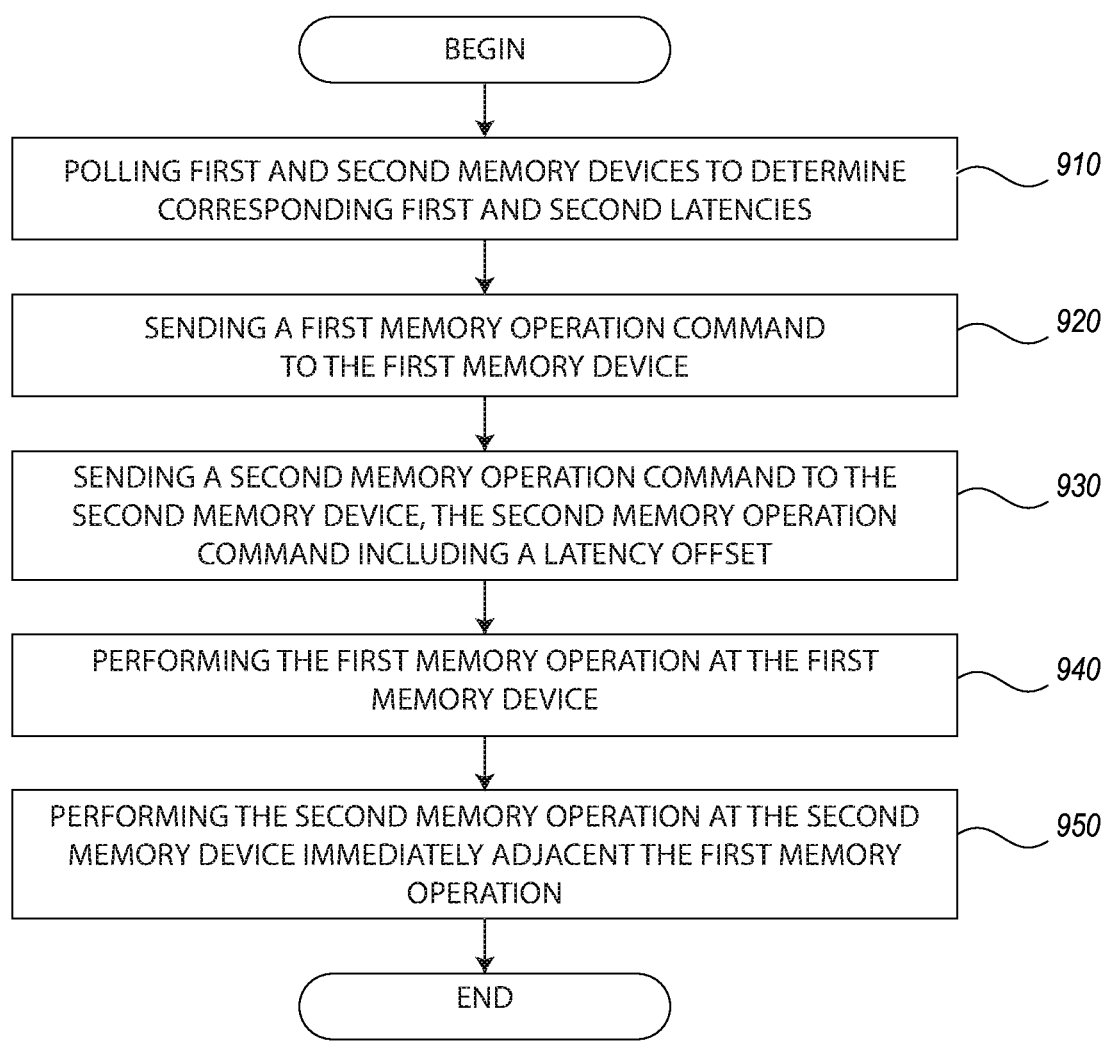

MEMORY DEVICES WITH PROGRAMMABLE LATENCIES AND METHODS FOR OPERATING THE SAME

CROSS-REFERENCE TO RELATED APPLICATION(S)

This application is a continuation of U.S. application Ser. No. 15/693,095, filed Aug. 31, 2017, which is incorporated herein by reference in its entirety.

This application contains subject matter related to an U.S. patent application by Matthew A. Prather et al., entitled "METHODS OF SYNCHRONIZING MEMORY OPERATIONS AND MEMORY SYSTEMS EMPLOYING THE SAME." The related application, of which the disclosure is incorporated by reference herein, is assigned to Micron Technology, Inc., and is identified as U.S. application Ser. No. 15/693,128, filed on Aug. 31, 2017.

TECHNICAL FIELD

The present disclosure generally relates to memory devices, and more particularly relates to memory devices with programmable latencies and methods for operating the same.

BACKGROUND

In memory systems with multiple memory devices operably coupled to a shared memory bus, it is frequently advantageous to synchronize the performance of various memory operations among the memory devices. For example, in a memory system in which multiple memory modules are connected to a single memory bus, it may be beneficial to synchronize a data transfer operation in one memory module with a termination mode in the other memory modules, so that the impedance is properly controlled for best signal quality during the data transfer operation.

One way to provide such synchronization is to provide memory systems with multiple memory devices that all have the same latencies in response to corresponding memory commands, so that a single command can be made on the command/address bus to command one of the memory devices to perform a data transfer operation (e.g., a read or a write operation) at the same time as the other devices are placed into a termination mode (e.g., by utilizing different chip select signals to indicate which memory device is the target of the read operation, and which are non-targets that should be placed in a termination mode). This approach, however, is limited to systems in which all of the memory devices on the shared memory bus have the same latency in response to a given command (e.g., in which the latency between the first memory device receiving a data transfer command and performing a corresponding data transfer operation is the same as the latency between the remaining memory devices receiving the termination mode command and entering a termination mode). Accordingly, it is desirable to provide improved methods of synchronizing memory operations and memory systems that employ the same.

BRIEF DESCRIPTION OF THE DRAWINGS

FIG. 1 is a timing diagram illustrating synchronized memory operations in a memory system with memory devices having matched latencies.

FIG. 2 is a timing diagram illustrating out-of-sync memory operations in a memory system with memory devices having mismatched latencies.

FIG. 3 is a block diagram schematically illustrating a memory system in accordance with an embodiment of the present technology.

FIG. 4 is a timing diagram illustrating synchronized memory operations in a memory system with memory devices having different latencies, in accordance with an embodiment of the present technology.

FIG. 5 is a block diagram schematically illustrating a memory device in a memory system in accordance with an embodiment of the present technology.

FIG. 6 is a flow chart illustrating a method of operating a memory device in accordance with an embodiment of the present technology.

FIG. 9 is a flow chart illustrating a method of operating a memory system in accordance with an embodiment of the present technology.

DETAILED DESCRIPTION

Figure 7:
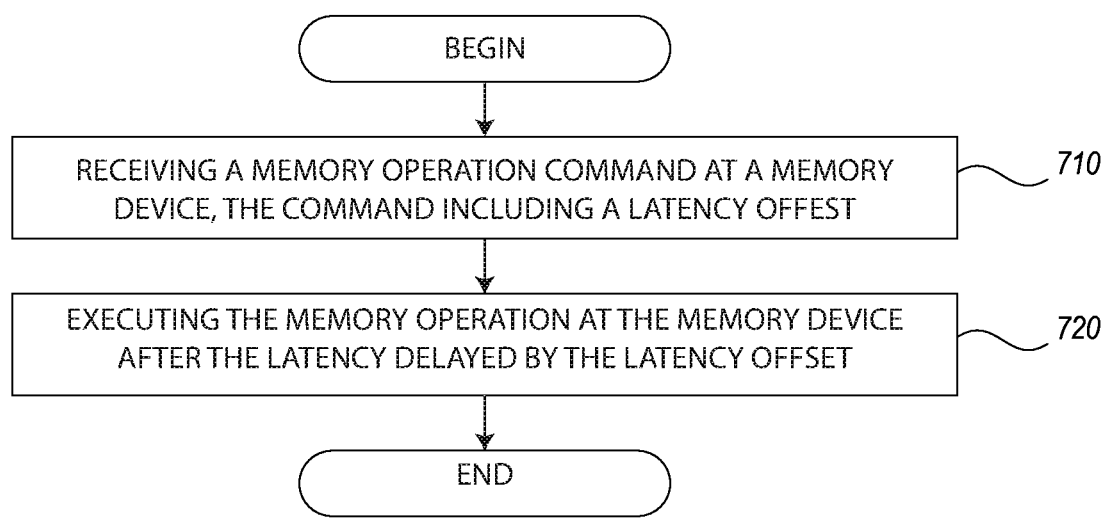
FIG. 7 is a flow chart illustrating a method of operating a memory device in accordance with an embodiment of the present technology.

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

FIG. 1 is a timing diagram 100 illustrating synchronized memory operations in a memory system with memory devices having matched latencies. As can be seen with reference to FIG. 1, in a memory system in which the memory devices on a shared memory bus have matched latencies, a single command (e.g., the read command 102 on CA bus 105) can be used to both (i) command a first one of the memory devices (e.g., with a target signal 115 on the chip select line 110 of the first memory device) to perform a data transfer operation and (ii) command a second one of the memory devices (e.g., with a non-targeted signal 125 on the chip select line 120 of the second memory device) to enter a termination mode (e.g., an on-die termination ("ODT") mode). In such a memory system, where the delay between the read command 102 and the read operation 132 at the first memory device (e.g., illustrated as a data packet on the data bus 130) is the same as the delay between the read command 102 and the activation of the ODT mode 140 at the second memory device (e.g., the 15 ns illustrated in timing diagram 100), synchronization of the memory operations can be achieved with a single conventional command.

In a memory system in which multiple memory devices on a shared memory bus have different latencies, however, the foregoing approach will not function well. This can be seen with reference to FIG. 2, which illustrates a timing diagram 200 corresponding to one such memory system. In a memory system in which the memory devices on a shared memory bus have different latencies (e.g., the 5 ns difference illustrated in timing diagram 200), utilizing a single command (e.g., the read command 202 on CA bus 205) to both (i) command a first one of the memory devices (e.g., with a target signal 215 on the chip select line 210 of the first memory device) to perform a data transfer operation with the default latency for that operation and (ii) command a second one of the memory devices (e.g., with a non-targeted signal 225 on the chip select line 220 of the second memory device) to enter a termination mode (e.g., an ODT mode) with the default latency for that operation will cause the read operation 232 at the first memory device (e.g., illustrated as a data packet on the data bus 230) and the ODT mode 240 of the second memory device to occur at different times (e.g., separated by 5 ns).

Accordingly, several embodiments of memory systems in accordance with the present technology can provide memory devices with programmable latencies that overcome the limitations of conventional memory systems. Several embodiments of the present technology are directed to a memory device comprising a memory array, operation circuitry configured to perform a memory operation in the memory array in response to a command received from a connected host device, and delay circuitry configured to delay the performance of the memory operation in response to one or more bits received with the command. The one or more bits indicate a duration by which to delay the performance of the memory operation.

FIG. 3 is a block diagram schematically illustrating a memory system 300 in accordance with an embodiment of the present technology. The memory system 300 includes a host 310 (e.g., a mobile phone, tablet, digital reader, digital media player, computer, appliance or the like) operably coupled by a shared memory bus 320 to both a first memory device 330 and a second memory device 340. The first and second memory devices 330 and 340 can have different latencies in response to memory commands. For example, the first and second memory devices 330 and 340 may both be NVDIMMs with the same 20 ns latency in response to a status command, and the same 15 ns latency in response to a termination command. Alternatively, the first and second memory devices 330 and 340 may be different memory modules (e.g., one DIMM and one NVDIMM) with different latencies in response to a termination command, and/or different latencies in response to a read/status command. To accommodate the different latencies of the first and second memory devices 330 and 340, the host 310 is configured to send a memory operation command including one or more bits by which to delay the performance of a memory operation (e.g., a delay offset) to one of the memory devices (e.g., to the memory device with the lower latency). By delaying the performance of the memory operation of the memory device with the lower latency by a duration approximately equal to the difference in latencies between the two memory devices 330 and 340, synchronization between the memory devices can be achieved despite their different latencies.

FIG. 4 is a timing diagram 400 illustrating this approach to synchronizing memory operations in a memory system with memory devices having different latencies in accordance with an embodiment of the present technology. As can be seen with reference to FIG. 4, in a memory system in which the memory devices on a shared memory bus have different latencies, sending commands including delay offsets to one or more of the memory devices can be used to synchronize the operations of the memory devices. In this regard, the timing diagram 400 illustrates a modified read command 402 including one or more bits that specify a delay offset of 5 ns being issued on the CA bus 405. This modified read command 402 operates to both (i) command a first one of the memory devices (e.g., with a target signal 415 on the chip select line 410 of the first memory device) to perform a data transfer operation (e.g., a status operation) with the default (e.g., 20 ns) latency for that operation and (ii) command a second one of the memory devices (e.g., with a non-targeted signal 425 on the chip select line 420 of the second memory device) to enter a termination mode (e.g., an ODT mode) with latency offset of 5 ns for that operation. As the default latency for entering a termination mode for the second memory device is only 15 ns, the inclusion of a delay offset of 5 ns in the command to the non-targeted memory device causes the read operation 432 at the first memory device (e.g., illustrated as a data packet on the data bus 430) and the ODT mode 440 of the second memory device to occur simultaneously.

According to one aspect of the present technology, a connected host device can determine the latencies of each memory device in response to different commands in a variety of ways. For example, the host device can poll the memory devices to determine the latency of each memory device in response to each memory command (e.g., where the memory devices are configured to respond to such a polling request with their predetermined latencies). Alternatively, the host device can test each memory device by issuing memory commands to the memory device and measuring the delay in response to each memory command.

Although in the foregoing embodiment the modified read command 402 is directed to both the first and second memory devices by leveraging different chip select signals to indicate different command interpretations to the first and second memory devices, in other embodiments different commands may be issued on the CA bus 405 to the memory devices to achieve memory device synchronization. In this regard, the current approach to synchronization of memory operations is not limited to synchronizing a termination mode with a data transfer operation. Rather, any two or more memory operations that require synchronization (e.g., execution at a same time, or even execution at predetermined different times) can benefit from the foregoing approach of including one or more bits with a memory operation command that specify a delay offset in the performance of that command.

Although in the foregoing embodiments, memory systems comprising two memory devices with different latencies are described, the present technology has application to memory systems with any number of memory devices. For example, the foregoing approach to synchronizing memory operations could be applied to a memory system having three or more memory devices, of two different types (e.g., two NVDIMMs and one DIMM, three DIMMs and one NVDIMM, two DIMMs with a first set of a latencies, and two DIMMs with a second set of latencies, etc.). Alternatively, the foregoing approach to synchronizing memory operations could be applied to a memory system having three or more memory devices, of more than two different types (e.g., three DIMMs each having a different set of latencies, four NVDIMMs, each having a different set of latencies, a mixture of DIMMs and NVDIMMs with various latencies, etc.).

Moreover, in other embodiments of the present technology, the foregoing approach to delaying the performance of a memory operation by a delay offset included with a memory command can be utilized for purposes other than the synchronization of multiple memory devices. For example, in a memory system including only a single memory device having different latencies in response to different memory commands, including delay offsets in the memory commands issued to a memory device can provide additional flexibility in bus scheduling (e.g., performing memory operations in a sequence other than that in which the memory commands are issued, exploiting CA bus availability to issue commands during a free time slot on the CA bus, etc.).

In this regard, FIG. 5 schematically illustrates a memory system including a single memory device in accordance with an embodiment of the present invention. The memory system 500 includes a memory device 510 operatively coupled with a host device 550 by a command/address bus 552 and a data bus 554. The memory device 510 includes a memory array 512 (e.g., an array of memory cells, including volatile and/or non-volatile cells) and operation circuitry 514 configured to perform memory operations (e.g., read, write, erase, terminate, status, etc.) in the memory array in response to a command received from the host device 550 (e.g., via command/address bus 552). The memory device 510 further includes delay circuitry 516 configured to delay the performance of a memory operation in response to one or more bits received with the corresponding memory operation command from the host device 550. In this regard, the one or more bits can indicate a duration by which to delay the performance of the memory operation (e.g., a latency offset).

For example, the one or more bits can be a single bit indicating that the duration is either 0 or a predetermined delay (e.g., a delay configured during the manufacture or configuration of the memory device 510). Alternatively, the one or more bits can include a plurality of bits indicating that the duration is one of at least two predetermined delays (e.g., a long offset or a short offset of predetermined duration, or a long/medium/short offset, etc.). In yet another embodiment, the one or more bits can include multiple bits specifying a duration as a number of clock cycles by which to delay the performance of the memory operation.

In accordance with one aspect of the present disclosure, the number of bits available to specify a latency offset may depend upon the particular command protocol and command/address bus width of the memory device. For example, a non-target read command on a 14-bit wide command/address bus may include 8 bits of valid command data, and 4 bit positions in the bus that would otherwise be ignored by a conventional memory device. By configuring the memory device 510 to interpret these additional 4 bits of command/address bus data as specifying a latency offset, the flexibility with which transmissions on the data bus 554 can be scheduled is greatly increased.

Although in the embodiment illustrated in FIG. 5, the delay circuitry 516 is schematically shown within the operation circuitry 514, in other embodiments the delay circuitry 516 can be separate from the operation circuitry 514. The delay circuitry 516 can include a number of different circuit elements well known to those of skill in the art, including latches, relays, PLLs and the like. In an embodiment in which the memory device 510 is a memory module (e.g., a DIMM, RDIMM, NVDIMM or the like), the memory array 512 can be provided as a memory die of the memory module, while the delay circuitry 516 is provided either on or off of the memory die (e.g., as a separate die on the memory module).

Although the foregoing embodiments have described memory systems with reference to memory modules such as DIMMs, RDIMMs and NVDIMMs, those skilled in the art will readily appreciate that the present technology has application to memory systems with other kinds of memory devices, in any one of a number of formats (e.g., other than in-line memory modules). For example, memory systems including a number of different memory devices, including bare memory dies, memory packages, removably-attached memory cards or drives, etc., could benefit from the application of the foregoing approach to synchronizing memory operations.

Moreover, other embodiments of the present technology can involve providing operation commands with delay offsets that have application to systems other than memory systems. In this regard, the foregoing approach of providing operation commands with delay offsets can apply to any general purpose data interface shared by one or more responding devices, such as accelerators sharing a channel, or data buffers on one or more memory modules (e.g., LRDIMMs).

FIG. 6 is a flow chart illustrating a method of operating a memory device in accordance with an embodiment of the present technology. The method includes polling (e.g., with a connected host device) the memory device to determine a latency thereof (box 610). The method further includes sending (e.g., from the connected host device) a memory operation command including a latency offset to the memory device (box 620) and executing the memory operation at the memory device after the latency delayed by the latency offset (box 630).

FIG. 7 is a flow chart illustrating a method of operating a memory device in accordance with an embodiment of the present technology. The method includes receiving a memory operation command including a latency offset at a memory device (box 710) and executing the memory operation at the memory device after the latency delayed by the latency offset (box 720).

Figure 8:
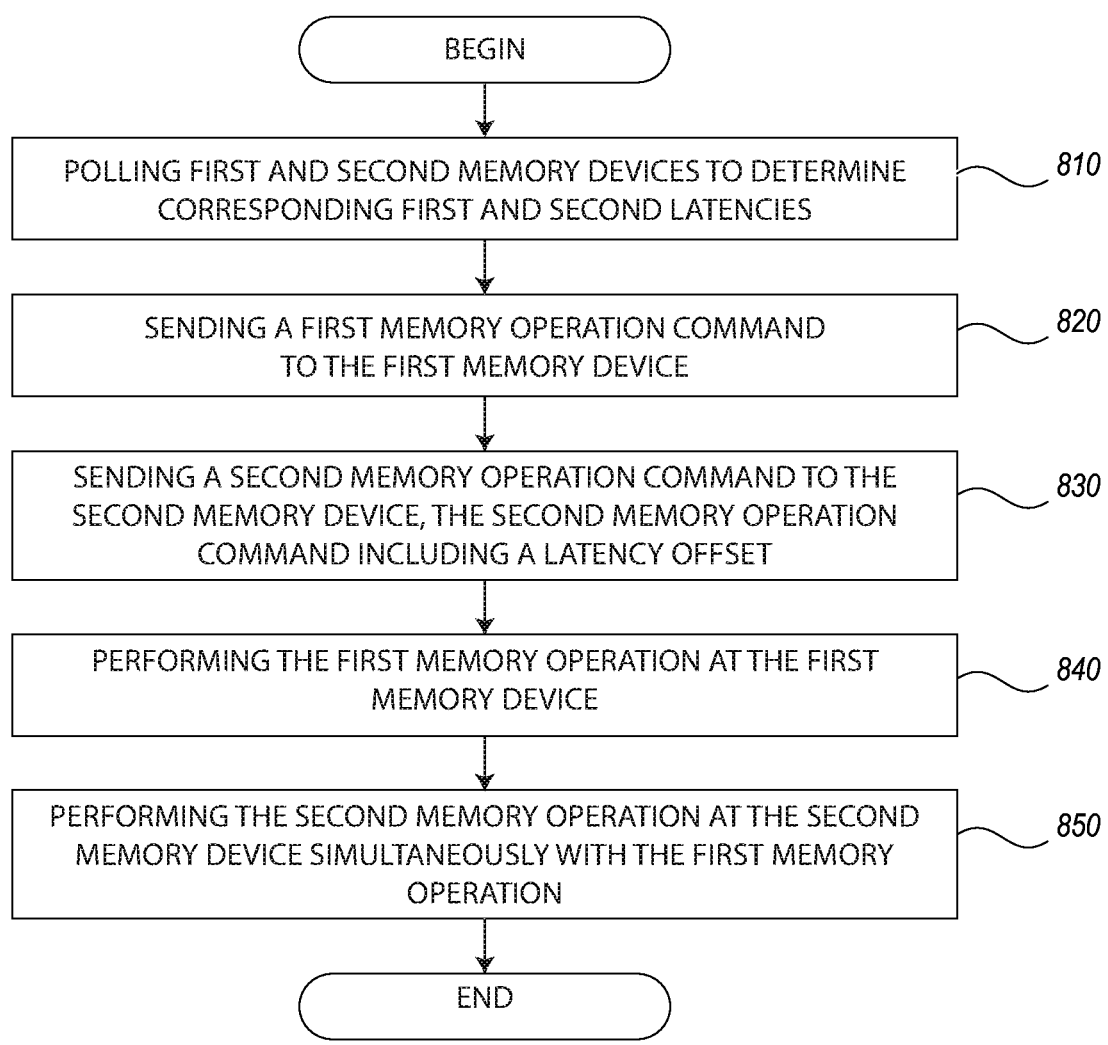
FIG. 8 is a flow chart illustrating a method of operating a memory system in accordance with an embodiment of the present technology.

FIG. 8 is a flow chart illustrating a method of operating a memory system in accordance with an embodiment of the present technology. operating a memory system in accordance with an embodiment of the present technology. The memory system includes a first memory device having a first latency corresponding to a first memory operation command and a second memory device having a second latency corresponding to a second memory operation command. The first latency can differ from the second latency by a latency difference, or in another embodiment may be about equal to the second latency. The method includes polling the first and second memory devices to determine the first and second latencies (box 810). The method further includes sending the first command to the first memory device (box 820) and sending the second command including a latency offset to the second memory device (box 830). The method further includes performing the first memory operation at the first memory device (box 840) and performing the second memory operation at the second memory device simultaneously with the first memory operation (box 850).

FIG. 9 is a flow chart illustrating a method of operating a memory system in accordance with an embodiment of the present technology. operating a memory system in accordance with an embodiment of the present technology. The memory system includes a first memory device having a first latency corresponding to a first memory operation command and a second memory device having a second latency corresponding to a second memory operation command. The first latency can differ from the second latency by a latency difference, or in another embodiment may be about equal to the second latency. The method includes polling the first and second memory devices to determine the first and second latencies (box 910). The method further includes sending the first command to the first memory device (box 920) and sending the second command including a latency offset to the second memory device (box 930). The method further includes performing the first memory operation at the first memory device (box 940) and performing the second memory operation at the second memory device immediately adjacent the first memory operation (box 950).

From the foregoing, it will be appreciated that specific embodiments of the invention have been described herein for purposes of illustration, but that various modifications may be made without deviating from the scope of the invention. Accordingly, the invention is not limited except as by the appended claims.

I claim:

1. A memory device comprising:
    a volatile memory array;
    operation circuitry configured to perform a memory operation in the memory array in response to a command received from a connected host device; and
    delay circuitry configured to delay the performance of the memory operation in response to one or more bits received with the command, the one or more bits indicating a duration by which to delay the performance of the memory operation.

2. The memory device of claim 1 wherein the memory operation is one of a read operation, a write operation, an erase operation, a terminate operation, and a status operation.

3. The memory device of claim 1 wherein the duration is a number of clock cycles by which to delay the performance of the memory operation.

4. The memory device of claim 1 wherein the one or more bits include a single bit indicating that the duration is either 0 or a predetermined delay.

5. The memory device of claim 1 wherein the one or more bits include a plurality of bits indicating that the duration is one of at least two predetermined delays.

6. The memory device of claim 1 wherein the memory device is a memory die, and wherein the operation circuitry and the delay circuitry are on the memory die.

7. The memory device of claim 1 wherein the memory device is a memory module, wherein the memory array is in a memory die of the memory module, and wherein the delay circuitry is off of the memory die.

8. The memory device of claim 1 wherein the memory device is one of a DIMM, an RDIMM, and an NVDIMM.

9. A memory system comprising:
    a volatile memory device having a latency in response to a command; and
    a host operably coupled to the memory device, and configured to:
        send the command to the memory device, the command including one or more bits indicating a latency offset by which to increase the latency of the memory device in the execution of the command.

10. The memory system of claim 9 wherein the command is one of a read command, a write command, an erase command, and a status command.

11. The memory system of claim 9 wherein the latency offset indicates a number of clock cycles by which to delay the execution of the command.

12. The memory system of claim 9 wherein the one or more bits include a single bit indicating that the latency offset is either 0 or a predetermined offset.

13. The memory system of claim 9 wherein the one or more bits include a plurality of bits indicating that the latency offset is one of at least two predetermined offsets.

14. The memory system of claim 9:
    wherein the command is a first command, the latency is a first latency in response to the first command, the latency offset is a first latency offset, and the memory device has a second latency different than the first latency in response to a second command, and
    wherein the host is further configured to send the second command to the memory device, the second command including one or more bits indicating a second latency offset by which to increase the second latency of the memory device in the execution of the second command.

15. The memory system of claim 14, wherein the first latency offset and the second latency offset are configured to schedule the execution of the first command immediately adjacent the execution of the second command.

16. A memory system comprising:
    a first volatile memory device having a first latency in response to a first command;
    a second volatile memory device having a second latency in response to a second command; and
    a host operably coupled to the first and second memory devices, and configured to:
        send the first command to the first memory device, the first command including a first one or more bits indicating a first latency offset by which to increase the first latency of the first memory device in the execution of the first command,
        send the second command to the second memory device, the second command including a second one or more bits indicating a second latency offset by which to increase the second latency of the second memory device in the execution of the second command.

17. The memory system of claim 16 wherein each of the first and second memory devices is one of a DIMM, an RDIMM, and an NVDIMM.

18. A method of operating a volatile memory device, comprising:
    receiving, at the volatile memory device having a latency in response to a memory operation command, the memory operation command including one or more bits indicating a latency offset by which to increase the latency in execution of the memory operation command;
    executing, after the latency increased by the latency offset, the memory operation command at the volatile memory device.

19. A method of operating a memory system, comprising:
    sending, to a volatile memory device having a latency in response to a memory operation command, the memory operation command including one or more bits indicating a latency offset by which to increase the latency in execution of the memory operation command;
    executing, after the latency increased by the latency offset, the memory operation command at the volatile memory device.

* * * * *